United States Patent
Ishida

(10) Patent No.: US 6,804,157 B2
(45) Date of Patent: Oct. 12, 2004

(54) CHARGING CIRCUIT AND SEMICONDUCTOR MEMORY DEVICE USING THE SAME

(75) Inventor: Terufumi Ishida, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/773,057

(22) Filed: Feb. 4, 2004

(65) Prior Publication Data

US 2004/0160260 A1 Aug. 19, 2004

Related U.S. Application Data

(62) Division of application No. 10/179,768, filed on Jun. 24, 2002, now Pat. No. 6,717,872.

(30) Foreign Application Priority Data

Jun. 27, 2001 (JP) ........................................ 2001-195518

(51) Int. Cl.[7] .............................. G11C 7/00; G11C 8/00
(52) U.S. Cl. ............. 365/203; 365/189.07; 365/189.09; 365/189.11; 365/193; 365/194; 365/202; 365/233
(58) Field of Search ............................ 365/203, 189.07, 365/189.09, 193, 194, 233, 202, 189.11

(56) References Cited

U.S. PATENT DOCUMENTS

| 4,943,745 | A | * | 7/1990 | Watanabe et al. ........... 327/262 |
| 5,177,707 | A | | 1/1993 | Edme |
| 5,870,346 | A | | 2/1999 | Komarek et al. |
| 6,052,016 | A | | 4/2000 | Sugiura et al. |
| 6,066,939 | A | | 5/2000 | Nagai et al. |
| 6,275,431 | B1 | | 8/2001 | Kojima et al. |
| 2002/0008688 | A1 | | 1/2002 | Yamamoto et al. |

FOREIGN PATENT DOCUMENTS

JP         59-008192         1/1984

* cited by examiner

*Primary Examiner*—David Nelms
*Assistant Examiner*—Ly Duy Pham
(74) *Attorney, Agent, or Firm*—Morrison & Foerster LLP

(57) ABSTRACT

A charging circuit includes a charging driving circuit, a time constant circuit, a control circuit, a voltage detection circuit, and a delay and inversion circuit. The charging driving circuit starts a charging operation in accordance with a delay signal output from the delay and inversion circuit, and terminates the charging operation in accordance with a detection signal output from the voltage detection circuit.

5 Claims, 4 Drawing Sheets

LP11, LN12 : Long
LN11, LP12, LP13, LN13: Short

CHARGING CIRCUIT AND SEMICONDUCTOR MEMORY DEVICE USING THE SAME

CROSS REFERENCE TO RELATED APPLICATIONS

This application is a divisional of U.S. Ser. No. 10/179,768, filed Jun. 24, 2002 now U.S. Pat. No. 6,717,872, which is a National Phase application of Japanese Patent Application Serial No. 2001-195518, filed Jun. 27, 2001, the contents of each of which are incorporated herein by reference in their entirety.

BACKGROUND OF THE INVENTION

1. Field of the Invention

The present invention relates to a charging circuit and a semiconductor memory device using the charging circuit, and in particular, to a charging circuit for charging a load circuit to a prescribed voltage level, and a semiconductor memory device for charging a bit line using the charging circuit.

2. Description of the Related Art

A semiconductor memory device includes a plurality of memory cells arranged in a matrix. Before reading information stored in one of the memory cells or writing information to one of the memory cells, a bit line connected to the memory cell needs to be charged. In the case of a nonvolatile semiconductor memory device, the charging operation is performed in order to raise the speed of reading the information from the memory cell. In the case of a volatile semiconductor memory device, the charging operation is performed in order to prevent inadvertent overwriting of the information stored in the memory cell when reading the information.

FIG. 7 shows an exemplary charging circuit 700 which is conventionally and generally used in a single bit semiconductor memory device. The charging circuit 700 includes three N-type MOS transistors N0, N1 and N2. A drain of the N-type MOS transistor N1 is connected to a power supply VCC via a resistor R1, and a source of the N-type MOS transistor N1 is connected to ground VSS. A gate of the N-type MOS transistor N1 is connected to a source of the N-type MOS transistor N2. A gate of the N-type MOS transistor N2 is connected to a node 23 between the drain of the N-type MOS transistor N1 and the resistor R1. A drain of the N-type MOS transistor N2 is connected to the power supply VCC. The gate of the N-type MOS transistor N2 is connected to a gate of the N-type MOS transistor N0, and the source of the N-type MOS transistor N2 is connected to a source of the N-type MOS transistor N0. The source of the N-type MOS transistor N0 is also connected to an output node VPR, which is an output terminal of the charging circuit 700. A drain of the N-type MOS transistor N0 is connected to the power supply VCC via a resistor R0. A node 22 between the drain of the N-type MOS transistor N0 and the resistor R0 is connected to a sense amplifier (not shown).

In the charging circuit 700, a load circuit to be charged (not shown) is connected to the output node VPR. The node 22 connected to the drain of the N-type MOS transistor N0 conveys a change in the level of the charging current, which is output from the output node VPR, to the sense amplifier as a change in the voltage. An inverter, including the N-type MOS transistor N1 and the resistor R1, detects the voltage level of the output node VPR from the gate of the N-type MOS transistor N1. Then, the inverter feeds back the voltage level of the output node VPR via the node 23, connected to the drain of the N-type MOS transistor N1, to the gate of the N-type MOS transistor N2 and to the gate of the N-type MOS transistor N0. Thus, the charging operation performed via the output node VPR and the operation of the sense amplifier are improved in speed.

FIG. 8 shows an exemplary charging circuit used for a semiconductor memory device including a pair of complementary bit lines (a bit line BIT and a bit line /BIT having a logic level inverted from the logic level of the bit line BIT). In FIG. 8, a power supply VM is a power supply or an output terminal of an internal voltage drop circuit.

The charging circuit 800 includes an N-type MOS transistor N3 between the power supply VM and the bit line BIT and an N-type MOS transistor N4 between the power supply VM and the bit line /BIT. The N-type MOS transistors N3 and N4 are load transistors. An N-type MOS transistor NEQ for equalizing the bit lines is provided between the bit lines BIT and /BIT (i.e., for charging the bit lines BIT and /BIT to an equal potential). In the case where a withstand voltage of the memory cell (not shown) connected to the bit lines BIT and /BIT is lower than the external supply voltage, the output terminal of the internal voltage drop circuit is used as the power supply VM.

Drains of the N-type MOS transistor N3 and N4 are connected to the power supply VM. A source of the N-type MOS transistor N3 is connected to the bit line BIT, and a source of the N-type MOS transistor N4 is connected to the bit line /BIT. Gates of the N-type MOS transistors N3 and N4 are connected to each other. A drain and a source of the N-type MOS transistor NEQ are respectively connected to the source of the N-type MOS transistor N3 and the source of the N-type MOS transistor N4. A gate of the N-type MOS transistor NKQ is connected to the gates of the N-type MOS transistors N3 and N4.

The N-type MOS transistor NEQ is connected to the bit lines BIT and /BIT so as to equalize the bit lines BIT and /BIT. The gate of the N-type MOS transistor NEQ receives an equalizing signal EQ1. The equalizing signal EQ1 is also input to the gates of the N-type MOS transistors N3 and N4.

While the equalizing signal EQ1 is at a HIGH logic level, the N-type MOS transistors N3, N4 and NEQ are all in an ON state. The source and the drain of the N-type MOS transistor N3 are conductive with each other, and the source and the drain of the N-type MOS transistor N4 are conductive with each other. Therefore, the voltage of the power supply VM is applied to the bit lines BIT and /BIT. Since the drain and the source of the N-type MOS transistor NBQ are also conductive with each other, the equalization operation is performed for charging the bit lines BIT and /BIT to an equal potential.

As a result, while the equalizing signal EQ1 is at a HIGH logic level, the voltage of the power supply VM is supplied to the memory connected to the bit lines BIT and /BIT.

As described above, the charging circuit 800 uses N-type MOS transistors. The threshold voltage drop function of the N-type MOS transistors is utilized to pre-charge the bit lines BIT and /BIT to 1/2 VCC. This provides the effect of reducing power consumption and noise while charging and discharging the bit lines BIT and /BIT.

A conventional single bit semiconductor memory device uses the charging circuit 700 shown in FIG. 7 so as to charge the bit line utilizing a voltage drop corresponding to the threshold voltage Vth of the N-type MOS transistors. A semiconductor memory device integrally including an internal voltage drop circuit uses the charging circuit 800 shown in FIG. 8. The complementary bit lines BIT and /BIT connected to all the memory cells are charged, using the voltage of the output terminal VM of the internal voltage drop circuit as the power supply voltage of the N-type MOS transistors.

The charging circuit 700 has the following problem. As the potential of the sources of the N-type MOS transistors increases during the charging operation, the difference in potential between the gate and the source of each N-type MOS transistor is reduced. This is accompanied by reduction in the driving capability of the N-type MOS transistors, which inevitably increases the charging time period.

The charging circuit 800 has the following problem. The load on the internal voltage drop circuit for supplying a voltage for charging is excessively high. Accordingly, an excessively large output capacity is required in order to obtain stable operation.

SUMMARY OF THE INVENTION

According to one aspect of the invention, a charging circuit for charging a prescribed load circuit to a prescribed potential includes a charging driving circuit connected to the load circuit for supplying a charging signal to the load circuit from an output end of the charging driving circuit; a time constant circuit for receiving the charging signal, changing a time constant of the charging signal and outputting a transition signal having a prescribed transition time period; a control circuit for outputting a control signal for setting a time constant of the time constant circuit in accordance with the prescribed load circuit; a voltage detection circuit for detecting that the transition signal output from the time constant circuit has reached the prescribed potential and outputting a detection signal; and a delay and inversion circuit for delaying, and inverting a logic level of, an externally input charging control signal, and outputting a delay signal. The charging driving circuit starts a charging operation in accordance with the delay signal output from the delay and inversion circuit, and terminates the charging operation in accordance with the detection signal output from the voltage detection circuit.

In one embodiment of the invention, the output end is grounded by the delay signal during a delay time period from the time when the charging control signal is input to the delay and inversion circuit until the time when the delay signal is output.

In one embodiment of the invention, an output section of the voltage detection circuit is a transfer gate which becomes conductive when the delay signal is placed into an active state. The transfer gate is connected to a gate of a P-type MOS transistor of the charging driving circuit. The gate of the P-type MOS transistor is connected to a pull-up circuit for placing the P-type MOS transistor into a non-conductive state when the delay signal is placed into an inactive state.

In one embodiment of the invention, the time constant circuit includes a plurality of P-type MOS transistors connected in series, and a plurality of N-type MOS transistors each having a source connected to a source of a respective P-type MOS transistor and a drain connected to a drain of the respective P-type MOS transistor. A gate of each of the plurality of P-type MOS transistors is connected to the ground. A well region of each gate is connected to a prescribed internal power supply of the charging circuit. A gate of each of the plurality of N-type MOS transistors receives a control signal output from the control circuit.

In one embodiment of the invention, an ON resistance of each of the plurality of N-type MOS transistors is set to be smaller than an ON resistance of each of the plurality of P-type MOS transistors.

According to another aspect of the invention, a semiconductor memory device includes the above-described charging circuit; a pair of complementary bit lines connected to a memory cell; and an equalizing circuit for equalizing the pair of complementary bit lines to an equal prescribed potential using an equalizing signal acting as a charging control signal. An output end of the charging driving circuit of the charging circuit is connected to the pair of complementary bit lines.

In one embodiment of the invention, the semiconductor memory device includes at least one more pair of complementary bit lines, wherein the output end of the charging driving circuit of the charging circuit is connected to the pairs of complementary bit lines.

In one embodiment of the invention, the equalizing circuit includes a pull-up circuit for charging the pair of complementary bit lines to a prescribed potential.

In one embodiment of the invention, the equalizing circuit includes a pull-up circuit for charging the pair of complementary bit lines to a prescribed potential, and the delay and inversion circuit of the charging circuit provides a delay time period which is at least equal to a time period required for the pair of complementary bit lines, charged to the prescribed potential by the pull-up circuit, to be discharged via the output end of the charging driving circuit.

In one embodiment of the invention, the delay and inversion circuit of the charging circuit provides a delay time period which is at least equal to a time period required for the pair of complementary bit lines, charged to the prescribed potential by the pull-up circuit, to be discharged via the output end of the charging driving circuit.

Thus, the invention described herein makes possible the advantages of providing a charging circuit for performing a stable charging operation at high speed without deteriorating the driving characteristics of MOS transistors included therein, and a semiconductor memory device using the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
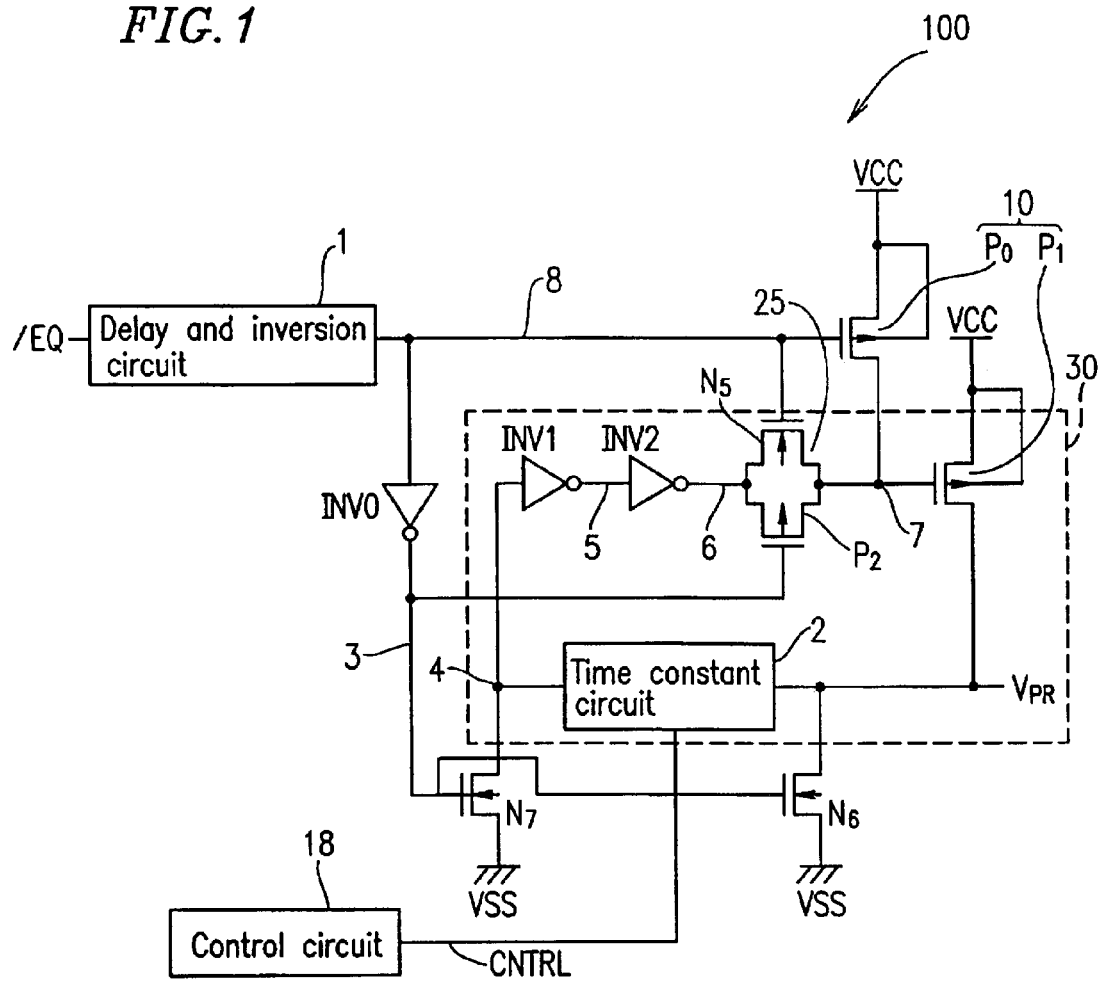
FIG. 1 shows a circuit configuration of a charging circuit according to an example of the present invention.

FIG. 1 shows a circuit configuration of a charging circuit 100 according to an example of the present invention The charging circuit 100 includes a charging driving circuit 10 including P-type MOS transistors P0 and P1 for supplying a charging current to a load circuit (not shown), a time constant circuit 2 for changing a time constant of a charging signal so as to determine a transition time period of the charging signal, a control circuit 18 for generating a control signal for controlling the time constant of the time constant circuit 2, a feedback circuit 30 (i.e., a voltage detection circuit) for detecting that a voltage which is output from the time constant circuit 2 has reached a prescribed potential, and a delay and inversion circuit 1 for delaying, and inverting a logic level of, a charging control signal input to the charging circuit 100 from an external device.

As described above, the charging driving circuit 10 includes the P-type MOS transistor P1 for outputting a charging current and the P-type MOS transistor P0 (pull-up circuit) for pulling up the P-type MOS transistor P1. A source of the P-type MOS transistor P1 is connected to a powersupply VCC, and a drain of the P-type MOS transistor P1 is connected to an output node VPR, connected the load circuit, for outputting a charging current. The load circuit is to be charged. The P-type MOS transistor P1 directly drives the load circuit via the output node VPR. A gate of the P-type MOS transistor P1 is connected to a drain of the P-type MOS transistor P0 via a node 7. A source of the P-type MOS transistor P0 is connected to the power supply VCC, and a gate of the P-type MOS transistor P0 is connected to an output end of the delay and inversion circuit 1. Thus, a delay signal 8 is input to the gate of the P-type MOS transistor P0.

The charging circuit 100 is used in a semiconductor memory device including complementary bit lines (a bit line BIT and a bit line /BIT having a logic level inverted from the logic level of the bit line BIT, not shown in FIG. 1). A pair of bit lines BIT and /BIT are provided for each memory cell of the memory device. The output node VPR is connected to the bit lines BIT and /BIT via an equalizing circuit (not shown in FIG. 1). The equalizing circuit equalizes the bit lines BIT and /BIT (i.e., charges the bit lines BIT and /BIT to an equal potential).

The output node VPR is connected to a drain of an N-type MOS transistor N6. A source of the N-type MOS transistor N6 is connected to ground VSS. A gate of the N-type MOS transistor N6 is connected an output end of an inverter INV0. Thus, the gate of the N-type MOS 20, transistor N6 receives a signal 3 which is obtained by inverting the logic level of the delay signal 8 by the inverter INV0. The signal 8 is obtained by delaying, and inverting the logic level of, an equalizing signal /EQ by using the delay and inversion circuit 1. The equalizing signal /EQ is generated by an internal timing generation circuit (not shown) of the semiconductor memory device. While the equalizing signal /EQ is at a HIGH logic level, the signal 3 is also at the HIGH logic level. When receiving a HIGH logic level signal 3 at the gate thereof, the N-type MOS transistor N6 is turned ON and thus the voltage level of the output node VPR is pulled down to the voltage level of the ground VSS.

Figure 2:
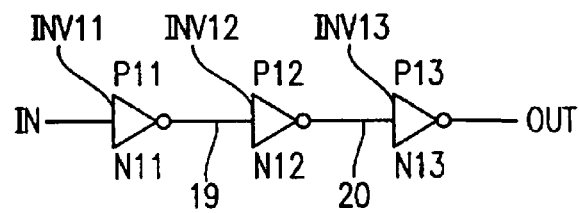
FIG. 2 shows a circuit configuration of a delay and inversion circuit included in the charging circuit shown in FIG. 1.

The delay and inversion circuit 1 receives the equalizing signal /EQ and generates the delay signal 8 based on the equalizing signal /EQ. FIG. 2 shows an exemplary specific configuration of the delay and inversion circuit 1.

As shown in FIG. 2, the delay and inversion circuit 1 includes inverters INV11, INV12, and INV13 in three stages, each having a CMOS structure. The inverter INV11 includes a P-type MOS transistor P11 and an N-type MOS transistor N11. The inverter INV12 includes a P-type MOS transistor P12 and an N-type MOS transistor N12. The inverter INV13 includes a P-type MOS transistor P13 and an N-type MOS transistor N13.

The P-type MOS transistor P11 of the first-stage inverter INV11 has a gate region (or well region) having a length LP11, which is sufficiently large to provide a sufficient delay time period with respect to a falling edge of a pulse of the equalizing signal /EQ. Similarly, the N-type MOS transistor N12 of the second-stage inverter INV12 has a gate region having a length LN12, which is sufficiently large to provide a sufficient delay time period with respect to a rising edge of a pulse of a signal 19 output from the first-stage inverter INV11. The third-stage inverter INV13 shapes the waveform of a signal 20 output from the second-stage inverter INV12, such that the delay signal 8 is output from the third-stage inverter INV13. The N-type MOS transistor N11 of the first-stage inverter INV11 has a gate region having a length LN11. The P-type MOS transistor P12 of the second-stage inverter INV12 has a gate region having a length LP12. The P-type MOS transistor P13 of the third-stage inverter INV13 has a gate region having a length LP13. The N-type MOS transistor N13 of the third-stage inverter INV13 has a gate region having a length LN13. The lengths LN11, LP12, LP13, and LN13 are smaller than the lengths LP11 and LN12.

The delay and inversion circuit 1 receives a HIGH logic level equalizing signal /EQ, and inverts the logic level of the HIGH logic level equalizing signal /EQ. As a result, after a prescribed delay time period, the delay and inversion circuit 1 outputs a LOW logic level delay signal 8. The LOW logic level delay signal 8 is input to the inverter INV0 (FIG. 1), which then outputs a HIGH logic level signal 3. The HIGH logic level signal 3 turns ON the N-type MOS transistor N6 and thus pulls down the voltage level of the output node VPR to the voltage level of the ground VSS. Thus, the signal 3 acts as a control signal for the N-type MOS transistor N6.

As shown in FIG. 1, the output end of the inverter INV0 is connected to a gate of an N-type MOS transistor N7. A drain of the N-type MOS transistor N7 is connected to a node 4, which is connected to an input end of the inverter INV1 and an output end of the time constant circuit 2. A source of the N-type MOS transistor N7 is connected to the ground VSS. In such a configuration, when the signal 3 is at a HIGH logic level, the N-type MOS transistor N7 is turned ON and pulls down the voltage level of the node 4 to the voltage. level of the ground VSS. Thus, the signal 3 also acts as a control signal for the N-type MOS transistor N7. The time constant circuit 2 is connected to both drains of the N-type MOS transistors N6 and N7. The time constant circuit 2 is provided with a control signal CNTRL from a control circuit 18 for adjusting the time constant of the time constant circuit 2.

As a result, when the equalizing signal /EQ input to the delay and inversion circuit 1 is at a HIGH logic level, the voltage level of the input end and the output end of the time constant circuit 2 is pulled down to the voltage level of the ground VSS. Thus, the voltage level of the node 4, connected to the input end of the inverter INV1 and the output end of the time constant circuit 2, can be fixed to the voltage level of the ground VSS. Therefore, no wasteful current flows from the inverter INV1, as it does when the node 4 is at an intermediate level. The operation of pulling down the voltage level of the node 4 to the voltage level of the ground VSS can be an initialization operation for starting a charging operation in the subsequent cycle.

An output end of the inverter INV1, having the input end connected to the node 4, is connected to an input end of the inverter INV2. A signal 5 is output from the output end of the inverter INV1 to the input end of the inverter INV2. An output end of the inverter INV2 is connected to an input end 6 of a transfer gate 25. The transfer gate 25 includes an N-type MOS transistor NS and a P-type MOS transistor P2. Sources of the N-type MOS transistor N5 and the P-type MOS transistor P2 are connected to each other, and drains of the N-type MOS transistor N5 and the P-type MOS transistor P2 are connected to each other. An output end of the transfer gate 25 is connected to the node 7, which is connected to the gate of the P-type MOS transistor P1 and the drain of the P-type MOS transistor P0. A gate of the N-type MOS transistor NS is connected to the delay and inversion circuit 1, and a gate of the P-type MOS transistor P2 is connected to the output end of the inverter INV0. Thus, the delay signal 8 is input to the gate of the N-type MOS transistor N5, and the signal 3 is input to the gate of the P-type MOS transistor P2. The node 7 is connected to the drain of the P-type MOS transistor P0. Therefore, when the equalizing signal /EQ is at a HIGH logic level, a LOW logic level delay signal 8 which is output from the delay and inversion circuit 1 is input to the gate of the P-type MOS transistor P0. Thus, the P-type MOS transistor P0 is turned ON, and the voltage level of the node 7 is pulled up to the voltage level of the power supply VCC.

Owing to such a configuration, while the equalizing signal /EQ is at a HIGH logic level and the delay signal 8 is at a LOW logic level, the P-type MOS transistor P0 is turned ON. Thus, the logic level of the gate of the P-type MOS transistor P1 is raised to a HIGH logic level via the node 7, and the P-type MOS transistor P1 is turned OFF. Therefore, no wasteful current flows from the output node VPR to the load circuit. A closed circuit including the P-type MOS transistor P1, the output node VPR, the time constant circuit 2, the node 4, the inverter INV1, the inverter INV2, the transfer gate 25 (output section of the voltage detection circuit), and the node 7 acts as the feedback circuit 30 for supplying the voltage level of the output node VPR to the gate of the P-type MOS transistor P1. The feedback circuit 30 has a function of a current detection circuit, as described above.

Backgates of the N-type MOS transistors N5, N6 and N7 are connected to the ground VSS, and backgates of the P-type MOS transistors P0, P1 and P2 are connected to the supply voltage VCC.

Figure 3:
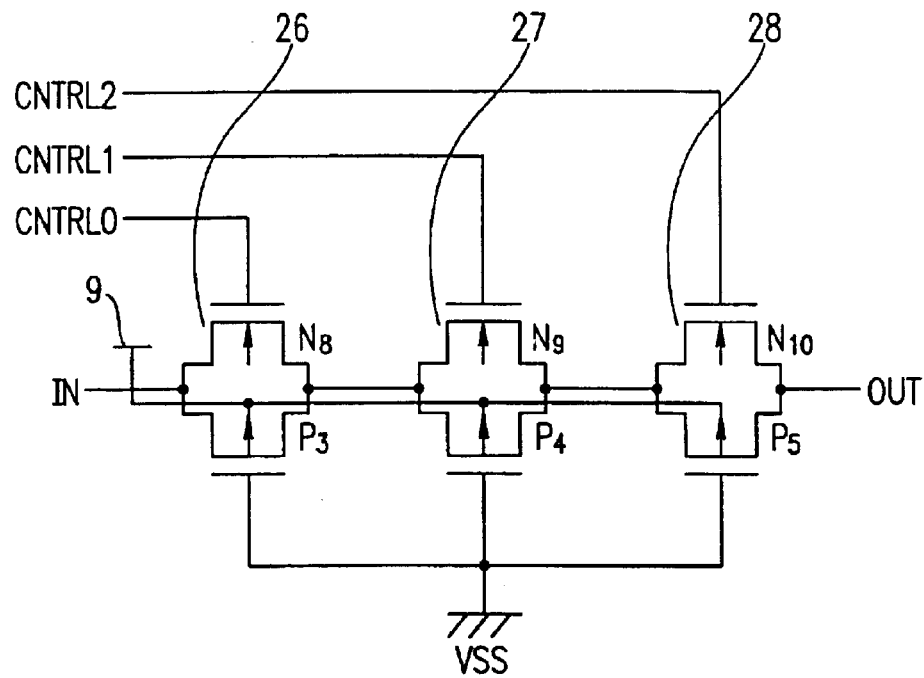
FIG. 3 shows a circuit configuration of a time constant circuit included in the charging circuit shown in FIG. 1.

FIG. 3 shows an exemplary specific configuration of the time constant circuit 2 shown in FIG. 1. As shown in FIG. 3, the time constant circuit 2 includes a series circuit including transfer gates 26, 27 and 28.

The transfer gate 26 includes an N-type MOS transistor N8 and a P-type MOS transistor P3. Sources of the N-type MOS transistor N8 and the P-type MOS transistor P3 are connected to each other. Drains of the N-type MOS transistor N8 and the P-type MOS transistor P3 are connected to each other. The transfer gate 26 receives a signal through the sources (input end) and outputs a signal through the drains (output end).

Similarly, the transfer gate 27 includes an N-type MOS transistor N9 and a P-type MOS transistor P4. Sources of the N-type MOS transistor N9 and the P-type MOS transistor P4 are connected to each other. Drains of the N-type MOS transistor N9 and the P-type MOS transistor P4 are connected to each other. The transfer gate 27 receives a signal through the sources (input end) and outputs a signal through the drains (output end).

The transfer gate 28 includes an N-type MOS transistor N10 and a P-type MOS transistor P5. Sources of the N-type MOS transistor N10 and the P-type MOS transistor P5 are connected to each other. Drains of the N-type MOS transistor N10 and the P-type MOS transistor P5 are connected to each other. The transfer gate 28 receives a signal through the sources (input end) and outputs a signal through the drains (output end).

The output end of the transfer gate 26 is connected to the input end of the transfer gate 27, and the output end of the transfer gate 27 is connected to the input end of the transfer gate 28. The input end of the transfer gate 26 acts an input (IN) end of the time constant circuit 2, and the output end of the transfer gate 28 acts as an output (OUT) end of the time constant circuit 2.

Backgates of the P-type MOS transistors P3, P4 and P5 are connected to a power supply 9, and gates of the P-type MOS transistors P3, P4 and P5 are connected to the ground VSS. Therefore, the P-type MOS transistors P3, P4 and P5 are always in an ON state (or active state). The power supply 9 may be connected to the power supply VCC (FIG. 1). Alternatively, in a semiconductor memory device having an internal voltage drop circuit, the power supply 9 may be connected to an output end of the internal voltage drop circuit.

Backgates of the N-type MOS transistors N8, N9 and N10 are connected to the ground VSS. A gate of the N-type MOS transistor N0 is supplied with a control signal CNTRL0, a gate of the N-type MOS transistor N9 is supplied with a control signal CNTRL1, and a gate of the N-type MOS transistor N10 is supplied with a control signal CNTRL2. The control signals CNTRL0, CNTRL1 and CNTRL2 are controlled to be ON or OFF by the control circuit 18 (FIG. 1).

The time constant circuit 2 operates as follows. When the P-type MOS transistors P3, P4 and P5 are all in an ON state, an ON resistance of the gate region of each transistor (channel resistance) acts as a resistance component. Similarly, when the N-type MOS transistors N8, N9 and N10 are all in an OFF state (or inactive state), a diffusion region provided as each of a source region and a drain region of each transistor acts as a capacitance component. Therefore, the time constant circuit 2 has a time constant, which is determined based on a resistance component in each of the P-type MOS transistors P3, P4 and P5 and a capacitance component in each of the N-type MOS transistors N8, N9 and N10. The time constant of the time constant circuit 2 acts as a time constant for the feedback circuit 30. The time constant can be adjusted by the ON/OFF control performed by the control signals CNTRL0 through CNTRL2, which are output from the control circuit 18. The reason for this is as follows.

When at least one of the N-type MOS transistors N8, N9 and N10 is in an ON state, the ON resistance of the N-type MOS transistor which is in the ON state shortcircuits the ON resistance of each of the P-type MOS transistors P3, P4 and P5, so as to reduce the time constant for the feedback circuit 30. The time constant for the feedback circuit 30 is reduced because the ON resistance of each of the N-type MOS transistors N8, N9 and N10 is designed to be significantly smaller than the ON resistance of each of the P-type MOS transistors P3, P4 and P5. The time constant circuit 2 is designed such that the time constant of the transfer gates 26, 27 and 28, including the N-type MOS transistors N8, N9 and N10 and the P-type MOS transistors P3, P4 and P5, is matched to the time constant of the state transition time period of the bit lines BIT and /BIT connected to each memory cell.

One bit line connected to a memory cell has, for example, a line resistance and a line capacitance of the material used for the line, a diffusion capacitance of the memory cell connected to the bit line, and an ON resistance and a capacitance component of a switching transistor for equalizing and charging the bitline. When, for example, there are 512 word lines, all the bit lines have a total resistance of about 4.6 kQ and a total capacitance of about 0.7 pF. The time constant circuit 2 is designed such that the time constant is substantially matched to the time constant of the bit lines having a total resistance of about 4.6 kQ and a total capacitance of about 0.7 pF.

The time constant circuit 2 determines the driving time period of the P-type MOS transistor P1 and also determines the charging level provided by the P-type MOS transistor P1. The time constant circuit 2 shown in FIG. 3 includes the three-stage transfer gates 26, 27 and 28. By changing the number of stages of the transfer gates (number of transfer gates connected in series), the charging level can be changed. Even after the number of stages of the transfer gates is determined, the time constant of the time constant circuit 2 can be adjusted and thus the charging level provided by the P-type MOS transistor P1 can be changed. The time constant of the time constant circuit 2 is adjusted by controlling the gates of the N-type MOS transistors connected in series to be ON or OFF using control signals output from the control circuit 18. Such an adjustment in the time constant can be conducted without changing the number of stages of the transfer gates. In this manner, the charging level provided by the P-type MOS transistor P1 can be adjusted in two stages while designing the charging circuit. This expands the freedom of design.

In this example, the time constant circuit 2 includes the transfer gates 26, 27 and 28 connected in series as shown in FIG. 3. Alternatively, a time constant circuit may include high resistance elements formed of polysilicon. Polysilicon has a high resistance and is used for the lines. A circuit having a time constant usually operates as follows. The time period in which the voltage level of the signal rises linearly is determined by a resistance component (R) of the time constant. The subsequent time period in which the voltage level of the signal increases non-linearly is determined by a capacitance component (C) of the time constant. A time constant is given by resistance component (R)×capacitance component (C). Even when the resistance component (R) increases, the time constant does not change if the capacitance component (C) decreases by the level of increase in the resistance component (R). The charging time period and the charging level of a load circuit to be charged are determined by the time constant of the load circuit. Therefore, as long as the time constant obtained by resistance component (R)×capacitance component (C) can be substantially matched to the time constant of the time constant circuit 2, any values of resistance component (R) and capacitance component (C) can be freely combined.

Therefore, when the high resistance elements are used for the time constant circuit 2, a desired time constant is obtained even when the capacitance component (C) of the high resistance elements is small. The time constant of the time constant circuit 2 can be adjusted, for example, as follows. A high resistance element is divided into a plurality of parts by low resistance metal lines; and the high resistance element, the resistance value of which is divided, is combined with the metal lines.

Figure 4:
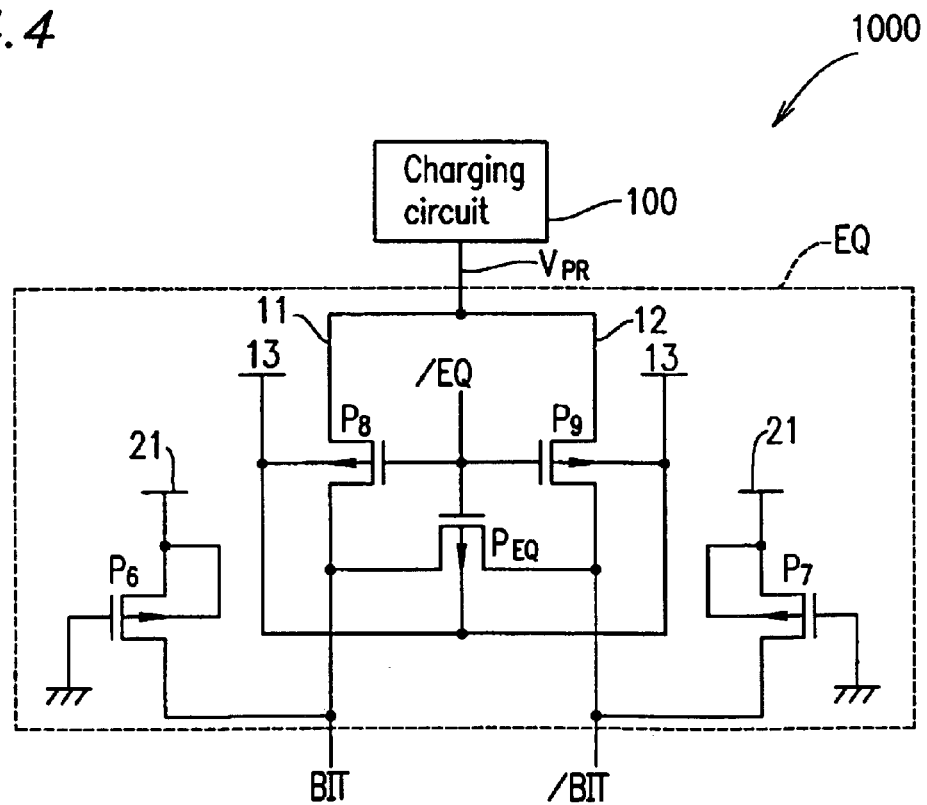
FIG. 4 shows a partial circuit configuration of a semiconductor memory device according to the present invention including the charging circuit shown in FIG. 1.

FIG. 4 shows a partial circuit configuration of a semiconductor memory device 1000 including the charging circuit 100 according to the present invention.

As shown in FIG. 4, the output node VPR of the charging circuit 100 is connected to a source of each of a P-type MOS transistor P8 and a P-type MOS transistor P9. A drain of the P-type MOS transistor P8 is connected to a bit line BIT, and a drain of the P-type MOS transistor P9 is connected to a bit line /BIT. The bit line /BIT has a logic level inverted from the logic level of the bit line BIT. A P-type MOS transistor PEQ is connected between the bit lines BIT and /BIT. In more detail, the drain of the P-type MOS transistor P8 is connected to a source of the P-type MOS transistor PEQ, and the drain of the P-type MOS transistor P9 is connected to a drain of the P-type MOS transistor PBQ. The P-type MOS transistor PEQ is provided for equalizing the bit lines BIT and /BIT (i.e., for charging the bit lines BIT and /BIT to an equal potential). A gate of the P-type MOS transistor P8, a gate of the P-type MOS transistor P9, and a gate of the P-type MOS transistor PRQ are connected together. Each of the gates receives an equalizing signal /EQ. A power supply 13 is connected to an external power supply or an output end of an internal voltage drop circuit. The power supply 13 is also connected to backgates of the P-type MOS transistors P8 and P9.

The bit line BIT is connected to a P-type MOS transistor P6, and the bit line /BIT is connected to a P-type MOS transistor P7. A source of each of the P-type MOS transistors P6 and P7 is connected to an output end 21 of the internal voltage drop circuit, and a gate of each of the P-type MOS transistors P6 and P7 is connected the ground VSS. A drain of the P-type MOS transistor P6 is connected to the bit line BIT, and a drain of the P-type MOS transistor P7 is connected to the bit line /BIT. Since the gates of the P-type MOS transistors P6 and P7 are connected the ground VSS, the P-type MOS transistors P6 and P7 are always in an ON state and thus constantly supply a current to the bit lines BIT and /BIT. Owing to such a structure, inadvertent overwriting of information stored in the memory cell connected to the bit lines BIT and /BIT is avoided while the information is being read from the memory. The P-type MOS transistors P6 and P7 are provided only for supplying a current for avoiding the inadvertent overwriting, and thus are designed so as to have a very small driving capability.

The charging circuit 100 (FIG. 1) operates as follows. For example, when the time constant of the time constant circuit 2 is maximum, the control signals CNTRL0 through CNTRL2 output from the control circuit 18 are all at a LOW logic level and the N-type MOS transistors N8, N9 and N10 are all in an OFF state. In this case, a charging operation performed by the P-type MOS transistor P1 (FIG. 1) raises the voltages level of the node 4 from the voltage level of the ground VSS at a gradient corresponding to the time constant of the time constant circuit 2. Such a rise is matched to a rise in the voltage level of the bit lines BIT and /BIT, connected to the output node VPR, caused by the charging operation performed by the P-type MOS transistor P1. Therefore, by the time when the bit lines BIT and /BIT are charged to a voltage level sufficient or a read or write operation, the voltage level of the node 4 has become HIGH, the logic levels of the outputs from the inverters INV1 and INV2 have been inverted, the HIGH logic level output from the inverter INV2 has been input to the gate of the P-type MOS transistor P1, the P-type MOS transistor P1 has been turned OFF, and thus the charging operation has been terminated. Therefore, the bit lines BIT and /BIT are charged to an optimum level.

In the case where the time constant of the time constant circuit 2 is maximum, the charging time period to the load circuit is maximum. Therefore, the charging level of the bit lines BIT and /BIT is also maximum. This may change transistor characteristics due to dispersion during the production process of the semiconductor memory device, resulting in the load of the bit lines being substantially lighter (lower) than as designed. In this case, the bit lines may undesirably be overcharged. In order to avoid this, the control circuit 18 controls at least one of the control signals CNTRL0 through CNTRL2 to be at a HIGH logic level. Owing to such a control, the time constant of the time constant circuit 2 is maintained at a level lower than the level corresponding to the maximum charging level, and thus the inverter INV1 inverts the logic level of the signal more rapidly. As a result, the operation time period of the P-type MOS transistor P1 is shortened, so that the bit lines BIT and /BIT are not overcharged.

In order to restrict the charging level of the load circuit to be LOW, the control circuit 18 may control at least one of the control signals CNTRL0 through CNTRL2 to be at a HIGH logic level. As a result, again, the operation time period (charging time period) of the P-type MOS transistor P1 is shortened, and thus the charging level of the bit lines BIT and /BIT is lowered. As can be appreciated from the above, the charging level of the bit lines BIT and /BIT is adjustable by controlling the signals. Therefore, even after the semiconductor memory device is produced, the charging level can be adjusted in accordance with the characteristics of the semiconductor chip.

The above-described manner of control is provided mainly for the purpose of preventing the charging level of the bit lines BIT and /BIT from exceeding the withstand voltage of the memory cell. A structure for setting the charging level relatively high is not adopted.

The delay and inversion circuit 1 (FIG. 1) is includes an odd number of inverters connected in series, each inverter having a CMOS structure as shown in FIG. 2. The delay and inversion circuit 1 has the following function in a semiconductor memory device in the case where the complementary bit lines BIT and /BIT as shown in FIG. 4 are maintained at the voltage level which is supplied from the output end 21 of the internal voltage drop circuit via the P-type MOS transistors P6 and P7, having a small driving capability, and are charged by the charging circuit 100. The delay and inversion circuit 1 provides a discharging time period which alleviates an inconvenience where the voltage level of the complementary bit lines BIT and /BIT is raised by the charging operation performed by the charging circuit 100 to a level higher than the level before the charging operation.

Such a discharging time period is provided in the case where the bit lines are charged and equalized before a word line and a memory cell corresponding to the word line are selected in a semiconductor memory device. Namely, the discharging operation is provided by turning ON the N-type MOS transistors N6 and N7 (FIG. 1) and grounding the complementary bit lines BIT and /BIT connected to the output node VPR and the node 4 during the time period by which the delay and inversion circuit 1 delays the output of the signal.

Figure 5:
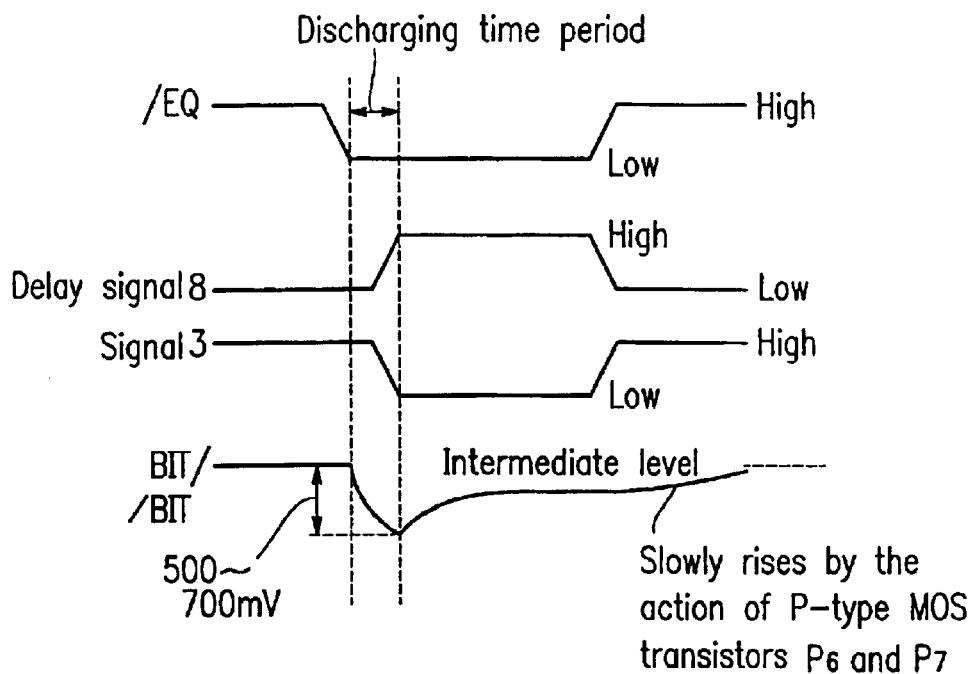
FIG. 5 is a timing diagram illustrating various signals used in the circuits shown in FIGS. 1 and 4.

FIG. 5 is a timing diagram illustrating waveforms of various signals used in the circuits shown in FIGS. 1 and 4.

When the equalizing signal /EQ (FIG. 1) is at a HIGH logic level, the delay signal 8 is at a LOW logic level and the signal 3 is at a HIGH logic level. The complementary bit lines BIT and /BIT (FIG. 4) maintain the voltage level which is supplied from the sources of the P-type MOS transistors P6 and P7, which is supplied from the output end 21 of the internal voltage drop circuit.

The signal 3 (FIG. 1) at a HIGH logic level is input to the gates of the N-type MOS transistors N6 and N7, and the N-type MOS transistors N6 and N7 are in an ON state. Therefore, the output node VPR and the node 4 are pulled down to the voltage level of the ground VSS. The delay signal 8 at a LOW logic level is input to the gate of the P-type MOS transistor P0. The P-type MOS transistor P0 is in an ON state, and the P-type MOS transistor P2 an the N-type MOS transistor N5 are in an OFF state. Accordingly, the node 7 is at a HIGH logic level, and the P-type MOS transistor P1 is in an OFF state.

When the equalizing signal /EQ falls to a LOW logic level, the P-type MOS transistors P8 and P9 (FIG. 4) are placed into an ON state. Since the N-type MOS transistors N6 and N7 are still in an ON state during the delay time period provided by the delay and inversion circuit 1 (FIG. 1), the complementary bit lines BIT and /BIT discharge, to the voltage level of the ground VSS, the voltage level maintained via the P-type MOS transistors P6 and P7 via the output node VPR and the N-type MOS transistors N6 and N7.

After the delay time period, the delay signal B rises to a HIGH level. Then, the signal 3 falls to a LOW level. Thus, the N-type MOS transistors N6 and N7 which receive the signal 3 via the gates thereof, and the P-type MOS transistor P0 which receives the signal 8 via the gate thereof, are turned OFF. The P-type MOS transistor P2 and the N-type MOS transistor N5 of the transfer gate 25 are turned ON. The P-type MOS transistor P1 is turned ON. Thus, the complementary bit lines BIT and /BIT are charged via the output node VPR.

The charging current supplied by the P-type MOS transistor P1 flows to the complementary bit lines BIT and /BIT and also to the feedback circuit 30 including the time constant circuit 2, via the output node VPR. The time constant of the time constant circuit 2 which is set by the transfer gates 26, 27 and 28, including the N-type MOS transistors N3, N9 and N10 and the P-type MOS transistors P3, P4 and P5, is matched in advance to the time constant of each of the complementary bit lines BIT and /BIT. Thus, the voltage level of the node 4 rises with a distortion in the waveform equivalent to that of the voltages of the complementary bit lines BIT and /BIT, which are connected to the memory cell via the output node VPR and an equalizing circuit EQ (FIG. 4). The equalizing circuit EQ is a part of the semiconductor memory device 1000 shown in FIG. 4 excluding the charging circuit 100.

When the voltage level of the node 4 keeps rising and exceeds the level of the inverter INV1 (FIG. 1), the signal 5 output from the inverter INV1 is inverted from a HIGH level to a LOW level, and the signal output from the inverter INV2 becomes a HIGH level. This HIGH level signal is conveyed to the node 7 via the transfer gate 25. As a result, the node 7 goes from a LOW level to a HIGH level, and therefore, the gate of the P-type MOS transistor P1 becomes a HIGH level and the P-type MOS transistor P1 is turned OFF. As a consequence, the charging operation of the complementary bit lines BIT and /BIT is terminated via the output node VPR.

The termination of the charging operation is not related to the rising of the equalizing signal /EQ shown in FIG. 5.

Therefore, the OFF state of the P-type MOS transistor P1 is controlled by detection of the charging level of the output node VPR. As a result, overcharging, due to the extension of the pulse width of the equalizing signal /EQ as a charging control signal, does not occur. Thus, the charging operation is entirely performed by the P-type MOS transistors P0 and P1 and thus is performed at high speed.

When the equalizing signal /EQ rises to a HIGH level, the gate of each of the P-type MOS transistors P8, P9 and PEQ (FIG. 4) becomes a HIGH level, and the P-type MOS transistors P8, P9 and PEQ are turned OFF. Thus, the charging operation of the entire circuit shown in FIG. 4 is terminated. At this point, the voltage level of the bit lines BIT and /BIT is determined by the time constant which is set in the time constant circuit 2 and the driving capability of the P-type MOS transistor P1. After the termination of the charging operation, the voltage level of the bit lines BIT and /BIT rises toward the voltage level of the output end 21 of the internal voltage drop circuit which is supplied to the source of each of the P-type MOS transistors P6 and P7 (FIG. 4). The reason is that the P-type MOS transistors P6 and P7 are always in an ON state.

Figure 6:
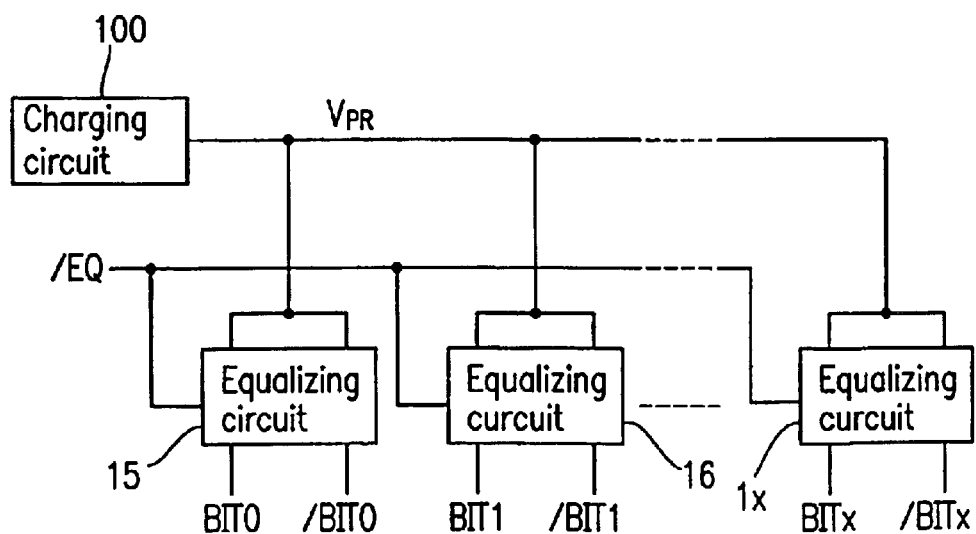
FIG. 6 shows a partial circuit configuration of another semiconductor, memory device according to the present invention including the charging circuit shown in FIG. 1.
Figure 7:
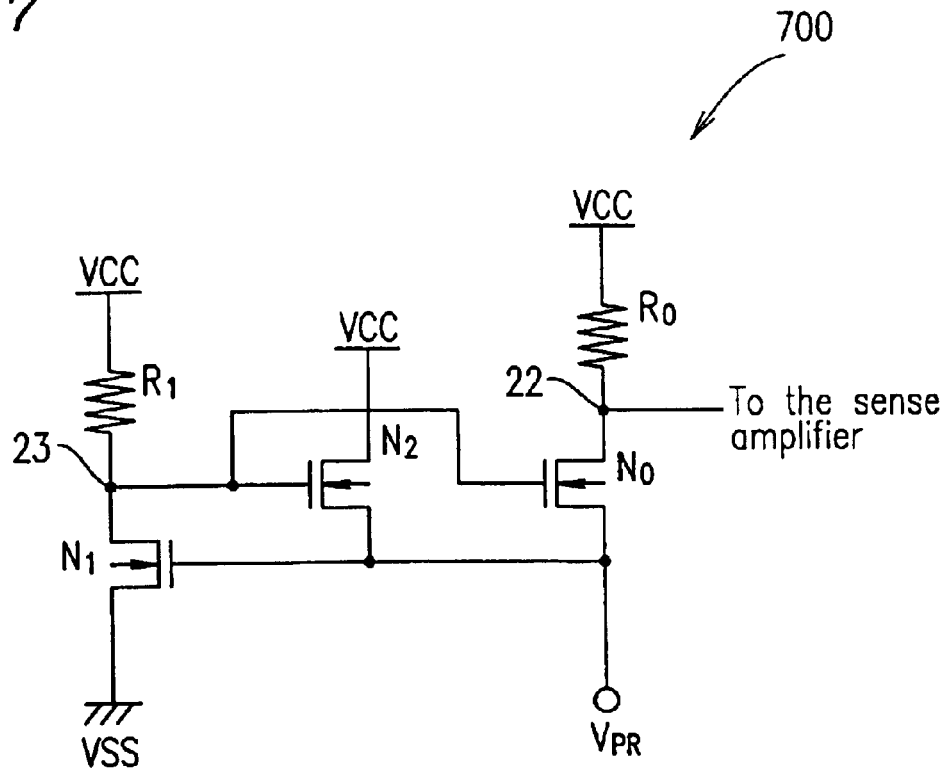
FIG. 7 shows a circuit configuration of a conventional charging circuit.
Figure 8:
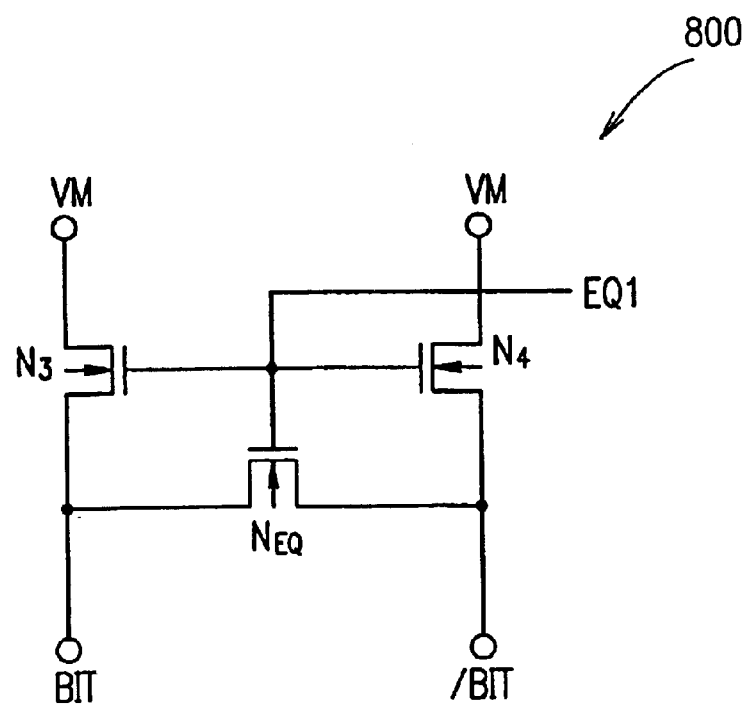
FIG. 8 shows a circuit configuration of another conventional charging circuit.

For charging a plurality of pairs of bit lines BIT and /BIT, the bit lines are connected to the output node VPR (FIG. 1) via equalizing circuits EQ. FIG. 6 shows an exemplary circuit configuration in this case.

As shown in FIG. 6, an output end of the charging circuit 100 is connected to the output node VPR, which is connected to a plurality of equalizing circuits 15, 16, . . . 1x. The equalizing circuit 15 is connected to a pair of bit lines BIT0 and /BIT0. The equalizing circuit 16 is connected to a pair of bit lines BIT1 and /BIT1. The equalizing circuit 1x is connected to a pair of bit lines BITX and /BITx. Each pair of bit lines is connected to a respective memory cell.

As described above, the.equalizing circuits 15, 16, . . . 1x each correspond to the equalizing circuit EQ shown in FIG. 4, namely, the part of the semiconductor memory device shown in FIG. 4 excluding the charging circuit 100. The number of equalizing circuits connected to the charging circuit 100 is not limited and can be determined in consideration of, for example, the output current or other parameters representing the driving capability of the P-type MOS transistor P1 (FIG. 1). The charging operation in the equalizing circuits 15,16, . . . 1x can be performed in substantially the same manner as that described with reference to FIGS. 1 through 5. Therefore, the present invention is sufficiently effective in charging a semiconductor memory device including a plurality of complementary bit lines as shown in FIG. 6.

A charging circuit according to the present invention includes a charging driving circuit for supplying a charging signal to a load circuit from an output end of the charging circuit; a time constant circuit for receiving the charging signal, changing a time constant of the charging signal and outputting a transition signal having a prescribed transition time period; a control circuit for outputting a control signal for setting a time constant of the time constant circuit in accordance with the load circuit a voltage detection circuit for detecting that the transition signal output from the time constant circuit has reached the prescribed potential and outputting a detection signal; and a delay and inversion circuit for delaying, and inverting a logic level of, an externally input charging control signal, and outputting a delay signal. The charging driving circuit starts a charging operation in accordance with the delay signal output from the delay and inversion circuit, and terminates the charging operation in accordance with the detection signal output from the voltage detection circuit. Owing to the above-described structure, the charging operation can be performed stably, at high speed, and without deteriorating the driving characteristics of MOS transistors included therein.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a charging driving circuit connected to the load circuit for supplying a charging signal to the load circuit from an output end of the charging driving circuit;
   a time constant circuit for receiving the charging signal, charging a time constant of the charging signal and outputting a transition signal having a prescribed transition time period;
   a control circuit for outputting a control signal for setting a time constant of the time constant circuit in accordance with the prescribed load circuit;
   a voltage detection circuit for detecting that the transition signal output from the time constant circuit has reached the prescribed potential and outputting a detection signal; and
   a delay and inversion circuit for delaying and inverting a logic level of an externally input charging control signal, and outputting a delay signal,
   wherein the charging driving circuit starts a charging operation in accordance with the delay signal output from the delay and inversion circuit, and terminates the charging operation in accordance with the detection signal output from the voltage detection circuit;
   a pair of complementary bit lines connected to a memory cell; and
   an equalizing circuit for equalizing the pair of complementary bit lines to an equal prescribed potential using an equalizing signal acting as a charging control signal,
   wherein an output end of the charging driving circuit of the charging circuit is connected to the pair of complementary bit lines.

2. A semiconductor memory device according to claim 1, comprising at least one more pair of complementary bit lines, wherein the output end of the charging driving circuit of the charging circuit is connected to the pairs of complementary bit lines.

3. A semiconductor memory device according to claim 1, wherein the equalizing circuit includes a pull-up circuit for charging the pair of complementary bit lines to a prescribed potential.

4. A semiconductor memory device according to claim 1, wherein the equalizing circuit includes a pull-up circuit for charging the pair of complementary bit lines to a prescribed potential, and the delay and inversion circuit of the charging circuit provides a delay time period which is at least equal to a time period required for the pair of complementary bit lines, charged to the prescribed potential by the pull-up circuit, to be discharged via the output end of the charging driving circuit.

5. A semiconductor memory device according to claim 3, wherein the delay and inversion circuit of the charging circuit provides a delay time period which is at least equal to a time period required for the pair of complementary bit lines, charged to the prescribed potential by the pull-up circuit, to be discharged via the output end of the charging driving circuit.

* * * * *